(12) United States Patent
Kartal et al.

(10) Patent No.: US 9,608,128 B2
(45) Date of Patent: Mar. 28, 2017

(54) BODY OF DOPED SEMICONDUCTOR MATERIAL HAVING SCATTERING CENTERS OF NON-DOPING ATOMS OF FOREIGN MATTER DISPOSED BETWEEN TWO LAYERS OF OPPOSING CONDUCTIVITIES

(75) Inventors: Veli Kartal, München (DE); Hans-Joachim Schulze, Ottobrunn (DE)

(73) Assignee: Infineon Technologies AG, Neubiberg (DE)

( * ) Notice: Subject to any disclaimer, the term of this patent is extended or adjusted under 35 U.S.C. 154(b) by 2632 days.

(21) Appl. No.: 10/392,509

(22) Filed: Mar. 20, 2003

(65) Prior Publication Data

US 2003/0154912 A1    Aug. 21, 2003

Related U.S. Application Data

(63) Continuation of application No. PCT/EP01/09866, filed on Aug. 27, 2001.

(30) Foreign Application Priority Data

Sep. 29, 2000 (DE) .................................. 100 48 437

(51) Int. Cl.
*H01L 29/36* (2006.01)
*H01L 29/861* (2006.01)
*H01L 29/32* (2006.01)

(52) U.S. Cl.
CPC ............ *H01L 29/861* (2013.01); *H01L 29/32* (2013.01); *H01L 29/36* (2013.01)

(58) Field of Classification Search
USPC ................ 257/335, 339, 341–342, 376, 607
See application file for complete search history.

(56) References Cited

U.S. PATENT DOCUMENTS

| 4,717,681 A | 1/1988 | Curran |
| 4,935,386 A | 6/1990 | Nakagawa et al. ........... 437/160 |
| (Continued) |

FOREIGN PATENT DOCUMENTS

| DE | 42 23 914 A1 | 1/1994 | ........... H01L 21/328 |
| DE | 10030381 A1 | 1/2002 |
| (Continued) |

OTHER PUBLICATIONS

Meriam-Webster Online Dictionary- Defining: Mean Free Path.*
(Continued)

*Primary Examiner* — Anh Mai
(74) *Attorney, Agent, or Firm* — Murphy, Bilak & Homiller, PLLC

(57) ABSTRACT

A method for producing a body (1) consisting of doped semiconductor material having a defined mean free path length (lambda n) for free charge carriers (CP), and a mean free path length (lambda r) for the free charge carriers (CP) which is smaller than the defined mean free path length (lambda n) is disclosed. An epitactic crystal layer (20) consisting of doped semiconductor material is produced on a substrate crystal (10) consisting of semiconductor material having the defined mean free path length (lambda n), said crystal layer having, at least locally, a mean free path length (lambda r) for the free charge carriers (CP) which is smaller than the defined mean free path length (lambda n). The body (1) can also be produced by joining two crystal bodies (10', 10") consisting of doped semiconductor material.

1 Claim, 3 Drawing Sheets

(56) References Cited

U.S. PATENT DOCUMENTS

| | | | |
|---|---|---|---|
| 5,023,696 A | | 6/1991 | Ogino |
| 5,102,810 A | | 4/1992 | Salih |
| 5,159,429 A | | 10/1992 | Bendernagel et al. |
| 5,858,855 A | | 1/1999 | Kobayashi |
| 5,877,518 A | | 3/1999 | Sakurai et al. |
| 6,037,632 A | * | 3/2000 | Omura et al. ............... 257/341 |
| 6,077,760 A | | 6/2000 | Feng et al. |
| 6,163,040 A | * | 12/2000 | Akiyama et al. ............ 257/131 |
| 2003/0154912 A1 | | 8/2003 | Kartal et al. |

FOREIGN PATENT DOCUMENTS

| | | | | |
|---|---|---|---|---|
| EP | 0 327 316 A2 | | 1/1989 | ............ H01L 29/32 |
| EP | 0327316 A2 | | 8/1989 | |
| EP | 0622834 A2 | | 11/1994 | |
| EP | 0 889 509 A2 | | 6/1998 | ........... H01L 21/322 |
| EP | 0889509 A2 | | 1/1999 | |
| JP | 1199469 | | 8/1989 | |
| JP | 07-193232 A | | 7/1995 | |
| JP | 08-037294 A | | 2/1996 | |
| JP | 09-260640 | * | 10/1997 | ........... H01L 29/744 |
| JP | 10012628 | | 1/1998 | |
| JP | 11-040633 A | | 2/1999 | |
| WO | 9815010 A1 | | 4/1998 | |
| WO | WO 98/15010 | | 4/1998 | ............ H01L 29/74 |
| WO | 0007245 A1 | | 2/2000 | |
| WO | WO 00/07245 | | 2/2000 | ........... H01L 29/739 |

OTHER PUBLICATIONS

English Translation of JP-09-260640.*
Wikipedia.org: Definition of Carrier Lifetime.*
Online Article: 2.2.3 Lifetime and Diffusion Length: relationship between carrier lifetime and diffusion length.*
Online Article from www.udel.edu/igert/pvcdrom. the relationship between diffusion length and carrier lifetime.*
International Search Report; PCT/EP01/09866, Apr. 25, 2002.
Takata, I. "A Simple Mobility Model for Electrons and Holes." The 11th International Symposium on Power Semiconductor Devices and ICs (ISPSD '99), 1999, pp. 269-272.
Ha, Y.-M. "Device Structure and Fabrication Process for High Performance Polysilicon Thin Film Transistors." Thesis for the degree of Doctor of Philosophy in the Department of Electrical Engineering, Korea Advanced Institute of Science and Technology, May 10, 1994.
Queirolo et al., "Incremental Sheet Resistance and Spreading Resistance: A Comparison," Journal of Vacuum Science & Technology B, Jan./Feb. 1992, pp. 408-412, vol. 10, No. 1, American Vacuum Society.
Tong, "Wafer Bonding and Layer Splitting for Microsystems: An Overview," Proceedings of the Electrochemical Society, Abstract No. 959.
Office Action mailed Jul. 2, 2010 in re: Japanese Patent Application No. 2002-531498.
Ang et al., "Growth and characterization of germanium and boron doped silicone epitaxial films". Journal of Electronic Materials. pp. 39-43. vol. 17, No. 1. Warrendale, PA. Jan. 1988.
Kola et al., "Defect and dopant control during silicone epitaxy using B and Ge". Defects in Electronic Materials Symposium 1988 (Boston, MA, 30.11-3.12.1987) Mater. Res. Soc.. pp. 641-644. vol. 104. Pittsburgh, PA.

* cited by examiner

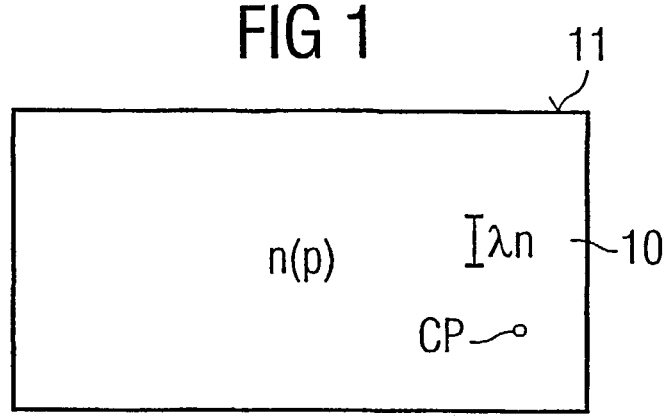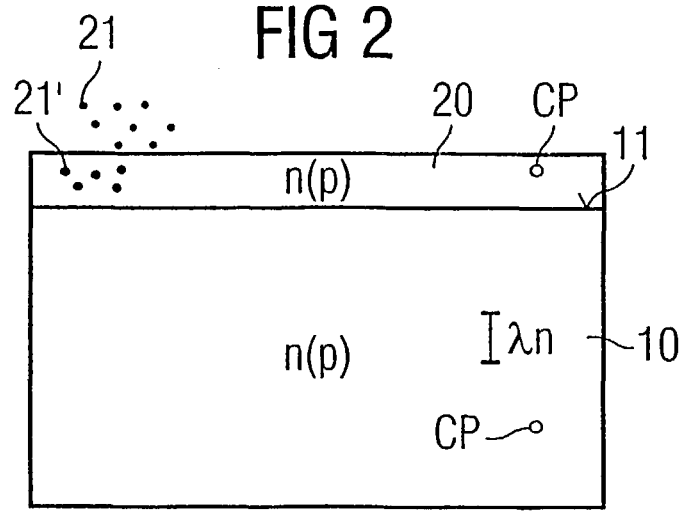

BODY OF DOPED SEMICONDUCTOR MATERIAL HAVING SCATTERING CENTERS OF NON-DOPING ATOMS OF FOREIGN MATTER DISPOSED BETWEEN TWO LAYERS OF OPPOSING CONDUCTIVITIES

CROSS REFERENCE TO RELATED APPLICATION

This application is a continuation of copending International Application No. PCT/EP01/09866 filed Aug. 27, 2001 which designates the U.S, and claims priority to German application number 10048437.9 filed Sep. 29, 2000.

BACKGROUND OF THE INVENTION

This invention relates to a method of producing a body of doped semiconductor material having a certain mean free path length for free charge carriers and a mean free path length for free charge carriers smaller than the certain mean free path length.

A body of the type defined above is proposed in the older German Patent Application 100 30 381.1 (=2000P12486 DE), the content of which is part of the present patent application. This body has a junction between doped semiconductor material of one type of conductivity and doped semiconductor material of a type of conductivity opposite that of the one type of conductivity. Due to the smaller mean free path length, the blocking ability of the body is increased. In the case of an electronic component produced with this body, in order to minimize the switching power losses and forward power losses that occur in the body during operation of this component, it may be desirable not to reduce the mean free path length throughout the entire body but instead only locally in that area in which high electric field strengths occur during a blocking state of the component.

SUMMARY OF THE INVENTION

The object of this invention is to provide a simple method of producing a body of the aforementioned type, which has a mean free path length that is reduced only locally and not over an area extending over the entire body.

This object can be achieved by a first method having the following step according to this invention:
growing a crystal layer of doped semiconductor material by epitaxy on a substrate crystal of doped semiconductor material having the certain mean free path length for the free charge carriers, where said crystal layer has at least locally a mean free path length for the free charge carriers that is smaller than the certain mean free path length.

This object can also be achieved by a second method having the following steps according to this invention:
Bonding by Wafer Bonding
a crystal body of doped semiconductor material having the certain mean free path length for the free charge carriers having at least locally a smaller mean free path length for the free charge carriers in comparison with the certain mean free path length,
to
another crystal body of doped semiconductor material having a mean free path length for the free charge carriers which is larger than the smaller mean free path length for the free charge carriers.

Preferably and advantageously, the first method comprises the steps of:
growing the crystal layer of doped semiconductor material having the certain mean free path length for the free charge carriers, and
producing scattering centers in the crystal layer.

The scattering centers reduce the certain mean free path length for the free charge carriers of the crystal layer so that the crystal layer having the scattering centers has a smaller mean free path length for the free charge carriers.

The scattering centers may be distributed over the entire area of the crystal layer, so that the mean free path length of the crystal layer is reduced over the entire area of the crystal layer or they may advantageously be presently only locally at one or more certain locations on the area of the crystal layer, so that the mean free path length is reduced over only a portion of the area of the crystal layer. In any case, the reduced mean free path length is limited essentially only to the extent of the crystal layer and does not extend to areas of the body outside the crystal layer.

Preferably and advantageously, the scattering centers are produced in the crystal layer by introducing non-doping particles of foreign matter into the crystal layer.

Particles of foreign matter are preferably atoms of foreign matter.

"Non-doping" means that the particles of foreign matter do not have any effect on the conductivity of the doped semiconductor material into which they are introduced. The particles of foreign matter act only as scattering centers in the semiconductor material, reducing the mean free path length already present in the semiconductor material.

Scattering centers may be produced in the crystal layer to advantage by adding non-doping particles of foreign matter during the growth of the crystal layer.

It is advantageous here if, during the growth of the crystal layer, a quantity of non-doping particles of foreign matter made available to produce scattering centers in the crystal layer is varied over time. Therefore, a local variation in the reduced mean free path length may be obtained to advantage in the direction vertical to the surface of the crystal layer.

Alternatively or additionally, scattering centers may also be produced in the crystal layer by diffusion of non-doping particles of foreign matter into the crystal layer.

Preferably and advantageously, additional doped semiconductor material of the body having a mean free path length for the free charge carriers which is equal to or greater than the certain mean free path length for the free charge carriers is applied to the crystal layer having the smaller mean free path length for the free charge carriers.

The additional doped semiconductor material of the body may advantageously have at least one crystal layer of doped semiconductor material grown epitaxially on the crystal layer having the smaller mean free path length; it may also have a crystal body of doped semiconductor material which is bonded to an exposed crystal layer on the substrate crystal by wafer bonding. The crystal body may thus be bonded to the crystal layer having the smaller mean free path length or to a crystal layer grown on this crystal layer.

Preferably and advantageously, the additional doped semiconductor material of the body has a type of conductivity opposite the type of conductivity of the substrate crystal, and the crystal layer having the smaller mean free path length has the type of conductivity of the substrate crystal and/or the opposite type of conductivity of the additional doped semiconductor material of the body.

The second method preferably and advantageously has the step of production of the crystal body having the smaller mean free path length by using a crystal body of doped semiconductor material having the certain mean free path length for the free charge carriers, and producing scattering centers in this crystal body of the certain mean free path length.

The crystal body here is understood to refer not only to an epitaxial crystal layer but instead also a compact crystal body, e.g., grown by crystal growth, e.g., an entire monocrystalline wafer of semiconductor material or a portion thereof. The crystal body may also have, for example, a substrate crystal of a semiconductor material on which are grown one or more epitaxial layers of semiconductor material which together with the substrate crystal form the crystal body.

The scattering centers reduce the certain mean free path length for the free charge carriers of the crystal body, so that the crystal body having the scattering centers has a smaller mean free path length for the free charge carriers.

The scattering centers may be distributed over an entire cross-sectional area of the crystal body, so that the mean free path length of the crystal layer is reduced over this entire cross-sectional area of the crystal body, or they may advantageously be present only locally at one or more certain locations in the cross-sectional area of the crystal body, so that the mean free path length is reduced over only a portion of the cross-sectional area of the crystal body. In any case, the reduced mean free path length is limited essentially only to the extent of this crystal body and does not extend to areas of the crystal body of doped semiconductor material outside of this crystal body.

Preferably and advantageously, the scattering centers are produced in the crystal body of the certain mean free path length by introducing non-doping particles of foreign matter into the crystal body.

The scattering centers may advantageously be produced in the crystal body by adding non-doping particles of foreign matter during the growth of the crystal body of the certain mean free path length. It is advantageous if, during the growth of the crystal body, the amount of non-doping particles of foreign matter made available for producing scattering centers in the crystal body is varied over time. In this way, a local variation in the reduced mean free path length in the direction vertical to the surface of the crystal body can be achieved to advantage.

Alternatively or additionally, scattering centers may also be produced by diffusion of non-doping particles of foreign matter into the crystal body.

Furthermore, the object can be achieved by a body of doped semiconductor material comprising a substrate crystal of doped semiconductor material having a certain mean free path length for free charge carriers and an epitaxial crystal layer of doped semiconductor material on the substrate crystal having at least locally a smaller mean free path length for the free charge carriers relative to the certain mean free path length.

The body may have at least one junction between doped semiconductor material of one type of conductivity and doped semiconductor material of a type of conductivity opposite that of the first type of conductivity. The body of doped semiconductor material may further comprise a crystal body of doped semiconductor material having a certain mean free path length for free charge carriers, whereby this body has at least locally a smaller mean free path length for the free charge carriers relative to the certain mean free path length, another crystal body of doped semiconductor material having a mean free path length for the free charge carriers which is greater than the smaller mean free path length for the free charge carriers of the one crystal body, and a bond produced by wafer bonding between the two crystal bodies. The body may further comprise at least one junction between the doped semiconductor material of one type of conductivity and the doped semiconductor material of a type of conductivity opposite the one type of conductivity.

BRIEF DESCRIPTION OF THE DRAWINGS

This invention is explained in greater detail in the following description on the basis of the drawings, which show:

FIG. 1: a side view of a substrate crystal of doped semiconductor material as the starting stage of a method according to an example of this invention;

FIG. 2: the substrate crystal according to FIG. 1 during growth of an epitaxial crystal layer of doped semiconductor material on the substrate crystal with the addition of non-doping particles of foreign matter, which produce the scattering centers in the crystal layer;

Figure 3:
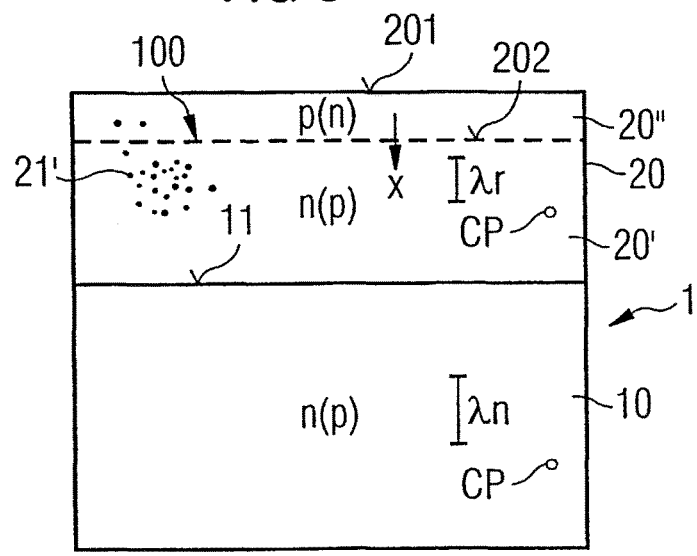
FIG. 3: the body of doped semiconductor material according to FIG. 2 after conclusion of the growth of the epitaxial crystal layer of doped semiconductor material on the substrate crystal with the addition of non-doping particles of foreign matter, which produce scattering centers in the crystal layer.

The figures are schematic and are not drawn to scale.

DETAILED DESCRIPTION OF THE PREFERRED EMBODIMENTS

In the method according to this example, a crystal layer of doped semiconductor material is grown epitaxially on a surface of a substrate crystal 10 of doped semiconductor material, e.g., on the surface 11 of crystal 10 which faces upward.

The doped semiconductor material of substrate crystal 10 has n-type doping, for example, and has a certain mean free path length for free charge carriers CP, at most amounting to a few electrons in the case of this example. If the semiconductor material of substrate crystal 10 has p-type doping, then the free charge carriers CP are mostly holes.

The certain mean free path length for the free charge carriers CP of substrate crystal 10 is, for example, the naturally occurring mean free path length $8n$ for the free charge carriers CP, which occurs naturally in the doped semiconductor material of substrate crystal 10.

The doped semiconductor material of the crystal layer to be grown is, for example, selected to be of the same type of conductivity as the doped semiconductor material of substrate crystal 10, i.e., n-type doping in the case of this example.

Like the semiconductor material of substrate crystal 10, the doped semiconductor material of the crystal layer to be grown has a certain mean free path length for the free charge carriers CP which may be the mean free path length for the free charge carriers CP naturally occurring in the doped semiconductor material of the crystal layer to be grown, mostly the electrons in the case of this example.

If the semiconductor material of the crystal layer to be grown is selected to be different from the semiconductor material of substrate crystal 10 such that the certain mean free path length for the free charge carriers CP of the crystal layer to be grown is smaller than the certain mean free path length for the same free charge carriers CP of substrate crystal 10, then an inventive body is already implemented.

Preferably, however, at least for a portion of the crystal layer to be grown adjacent to substrate crystal 10, the same doped semiconductor material is used as for substrate crystal 10, having the same certain mean free path length 8n for the same free charge carriers CP for at least this portion of the crystal layer to be grown as well as for substrate crystal 10, and the comparatively smaller mean free path length for the same free charge carriers CP is produced by creating scattering centers in the crystal layer which reduce the certain mean free path length for the free charge carriers CP of the crystal layer.

The scattering centers in the crystal layer are preferably created by introducing non-doping particles of foreign matter into the crystal layer, advantageously by adding non-doping particles of foreign matter to this layer during the growth of the crystal layer.

FIG. 2 illustrates this in greater detail. FIG. 2 shows substrate crystal 10 during epitaxial growth of the crystal layer on surface 11 of substrate crystal 10, whereby a portion of the crystal layer labeled as 20 adjacent to the substrate crystal 10 has already grown on this surface 11.

To grow the crystal layer 20, for example, liquid-phase, gas-phase and/or molecular stream epitaxy may be used.

For example, the non-doping particles of foreign matter, e.g., non-doping atoms of foreign matter are added to the phase and/or the molecular stream, which are indicated by dots 21 in FIG. 2 and which define the scattering centers 21' in the crystal layer 20 grown on the surface 11 of the substrate crystal.

After conclusion of the epitaxial growth, the body 1 according to this invention, shown as an example in FIG. 3, is formed with the crystal layer 20 in which the certain mean free path length path length 8n for the free charge carriers CP has been reduced to the smaller mean free path length 8r for these charge carriers CP due to the scattering centers 21' that have been introduced.

The non-doping scattering centers 21' may be distributed over the entire area of the crystal layer 20 in layer 20 [sic]. This area is represented, for example, by the surface 201 of crystal layer 20 facing away from the substrate crystal 10. In this case, the mean free path length for the free charge carriers is reduced over the entire area 201.

The scattering centers 21' may also be distributed over only one or more partial regions of the area 201 in the crystal layer 20 and may be omitted outside of these partial regions. In this case, the mean free path length for the free charge carriers is reduced only over the partial region or regions, and outside of these partial regions the certain mean free path length 8n for the free charge carriers CP prevails in the layer 20.

A quantity of non-doping particles of foreign matter 21 made available for the creation of scattering centers 21' in the crystal layer 20 may be varied over time during the growth of crystal layer 20. Therefore, the mean free path length for the free charge carriers in crystal layer 20 may be varied in direction x perpendicular to surface 201 of layer 20, i.e., in the direction perpendicular to the surface 11 of the substrate crystal 10.

In a concrete example of the body 1 according to FIG. 3, substrate crystal 10 and crystal layer 20 are each made of silicon, and the scattering centers 21' are defined by particles of foreign matter 21 in the form of germanium atoms and/or carbon atoms.

Alternatively or additionally, scattering centers 21' may be produced by diffusion of non-doping particles of foreign matter 21 into the finished crystal layer 20 after conclusion of the epitaxial growth.

Preferably a portion 20 adjacent to the surface 11 of substrate crystal 10 consists of semiconductor material of the same type of conduction as the semiconductor material of the crystal body 10 of the crystal layer 20, i.e., in the case of this example, conduction type n, and a portion 20" of semiconductor material of the p type of conduction which is opposite the type of conduction of the semiconductor material of crystal body 10 of crystal layer 20 is adjacent to a surface 202 of this part 20' facing away from surface 11 of substrate crystal 10, said part 20" also being adjacent to the surface 201 of crystal layer 20 facing away from substrate crystal 10.

This means that crystal layer 20 and thus body 1 have a pn junction 100 between p-doped semiconductor material and n-doped semiconductor material. This junction 100 extends in the interface between the n-doped semiconductor material and the p-doped semiconductor material of the crystal layer 20, i.e., in surface 202 of crystal layer 20.

Figure 4:
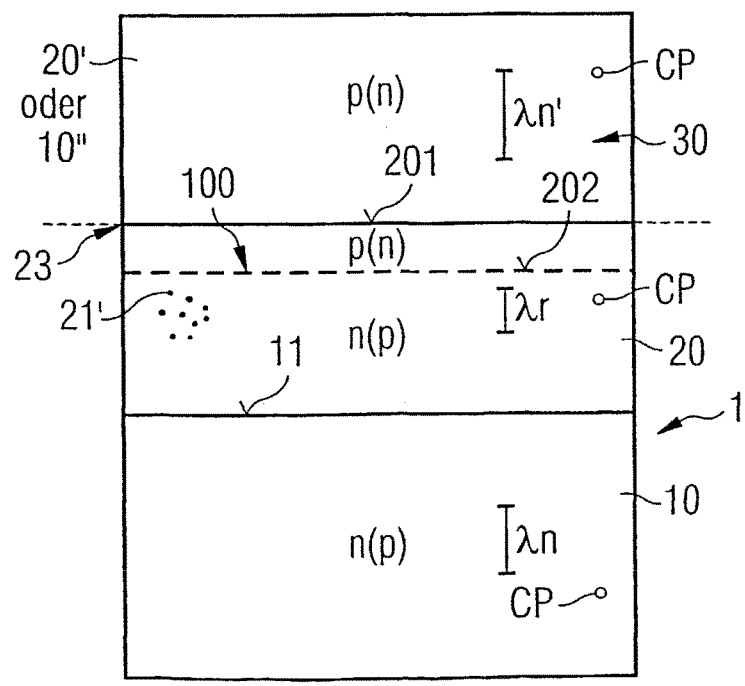
FIG. 4: the body of doped semiconductor material according to FIG. 3 after applying additional doped semiconductor material to the epitaxial crystal layer.

FIG. 4 shows another embodiment of body 1 according to FIG. 3 such that additional doped semiconductor material 30 of body 1 having a mean free path length 8n' for the free charge carriers CP which is greater than the smaller mean free path length 8r for the free charge carriers CP of crystal layer 20 is applied to the crystal layer 20 of body 1 having the smaller mean free path length 8r for the free charge carriers CP.

The additional doped semiconductor material 30 of body 1 may consist, for example, of at least one crystal layer of doped semiconductor material grown by epitaxial growth on the surface 201 of the crystal layer 20 having the smaller mean free path length 8r.

The semiconductor material 30 may also consist of a monocrystalline crystal body of doped semiconductor material similar to substrate crystal 10, for example, and bonded to an exposed crystal layer on substrate crystal 10 by wafer bonding. For example, the surface 31 of crystal body 30 facing crystal layer 20 and the surface 201 of crystal layer 20 may be bonded together, in which case this bond 23 between the two surfaces 31 and 201 is produced by wafer bonding.

Wafer bonding per se is a known bonding technique (see, for example, Q. Y. Tong, "Waferbonding and Wafer Splitting for Microsystems," Proceedings of the Electrochemical Society, 99-2, page 959 (1999)).

In the preferred embodiment of the example according to FIG. 4, the additional doped semiconductor material 30 of body 1 is doped with p-type doping like the adjacent part 20" of crystal layer 20, and thus it has the opposite type of doping from substrate crystal 10.

This embodiment of body 1 according to FIG. 4 has special advantages when the mean free path length of the n-doped semiconductor material of crystal layer 20 is varied in direction x perpendicular to surface 201 of crystal layer 20 such that the mean free path length is reduced to a greater extent in the area where an electric field strength is higher in crystal layer 20 and is reduced to a lesser extent there where the electric field strength is lower in crystal layer 20. Such field strengths are known to occur when an electric blocking voltage is applied at junction 100.

Therefore, it is also possible to accomplish the result that an increase in the conducting-state voltage at junction 100 is less than in the case of a reduction in the mean free path length for the free charge carriers in the crystal layer 20 which is homogeneous in direction x (the reduction is homogeneous) and thus also an improved compromise can be achieved between the switching losses and the losses that occur in the conducting state.

Due to the reduced mean free path length for the free charge carriers in crystal layer 20, the so-called critical electric field strength in particular may be increased greatly to advantage and thus the required thickness of a zone in body 1 which takes up the space charge zone required for achieving this blocking voltage is greatly reduced at a certain applied blocking voltage.

Thus, with a body 1 it is now possible to produce the electrically active zone completely by epitaxial methods even in the case of electronic components having a high blocking ability of 2 to 6 kV, for example.

A novel body 1 of doped semiconductor material is created through this invention; it has a substrate crystal 10 of doped semiconductor material having a certain mean free path length 8$n$ for free charge carriers CP and an epitaxial crystal layer 20 of doped semiconductor material on the substrate crystal 10 which has at least locally a smaller mean free path length 8$r$ for the free charge carriers CP relative to the certain mean free path length 8$n$.

A preferred and advantageous embodiment of this body 1 has at least one pn junction 100 between p-doped semiconductor material and n-doped semiconductor material. The crystal layer 20 may consist of p-doped and/or n-doped semiconductor material.

In the embodiment according to FIG. 4, the crystal layer 20 consists of p-doped and n-doped semiconductor material, for example, and the pn junction 100 extends in the surface 202 of the crystal layer 20.

If, in the case of FIG. 3 or 4, the crystal layer 20 consisted of p-doped semiconductor material, then the pn junction 100 would extend in the surface 11 of the substrate crystal 10.

If in the case of FIG. 3 the crystal layer 20 consisted of n-doped semiconductor material, the pn junction 100 would extend in the surface 11 of the substrate crystal 10.

Figure 5:
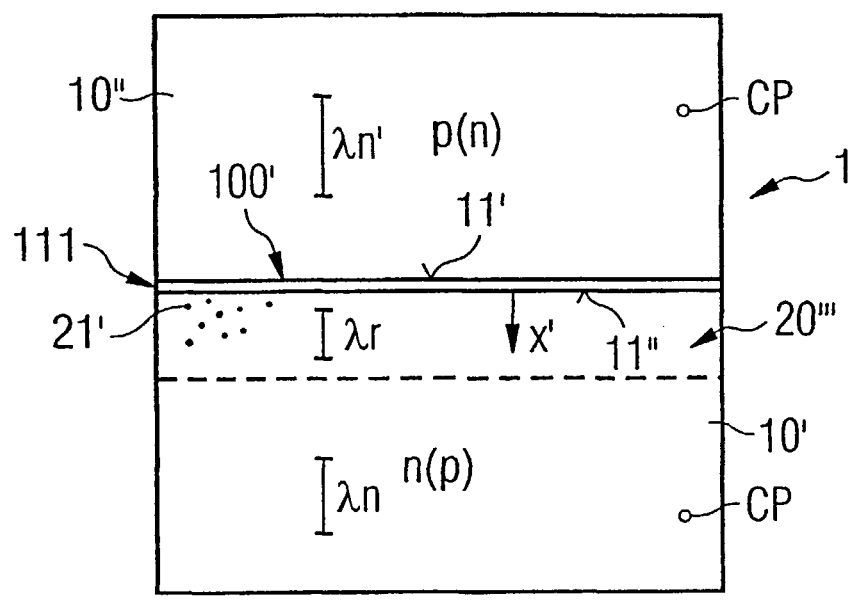
FIG. 5: a side view of a body according to this invention comprising a monocrystalline crystal body of doped semiconductor material having an area in which one mean free path length for free charge carriers is reduced, and comprising another monocrystalline crystal body of doped semiconductor material bonded to the one crystal body, where the bond is produced by wafer bonding.

The body 1 of doped semiconductor material illustrated in FIG. 5 has a uniform crystal body 10' of doped semiconductor material having a certain mean free path length 8$n$ for free charge carriers CP having a smaller mean free path length 8$r$ for the free charge carriers CP relative to the certain mean free path length 8$n$ in a region 20' adjacent to, for example, the upward-facing surface 11' of the crystal body 10'.

Region 20' may extend over the entire surface 11' or only over one or more partial regions of surface 11'. Region 20' extends in direction x' perpendicular to the surface 11' of the crystal body 10', preferably over only a portion of crystal body 10'. The smaller mean free path length 8$r$ may vary in this direction x'.

Another uniform crystal body 10" of doped semiconductor material whose semiconductor material has a mean free path length 8$n'$ for the free charge carriers CP which is greater than the smaller mean free path length 8$r$ of the crystal body 10' is bonded to the crystal body 10'. The bond between the two crystal bodies 10' and 10' is established by wafer bonding. For example, the surfaces 11' and 11" of the crystal bodies 10' and 10" are bonded together facing one another, the bond 111 between the two surfaces 11' and 11" being established by wafer bonding.

For example, the crystal body 10' is n-doped and the crystal body 10" is p-doped, which means that the body 1 according to FIG. 5 has a pn junction 100' between p-doped semiconductor material and n-doped semiconductor material. This junction 100' extends in the interface between the n-doped crystal body 10' and the p-doped crystal body 10", i.e., along the surfaces 11' and 11" of the crystal bodies 10' and 10".

Region 20''' of the smaller mean free path length 8$r$ is defined by the scattering centers 21' in crystal body 10', these being distributed in the crystal body 10' and reducing the certain mean free path length 8$n$ of the semiconductor material of this body 10'.

Figure 6:
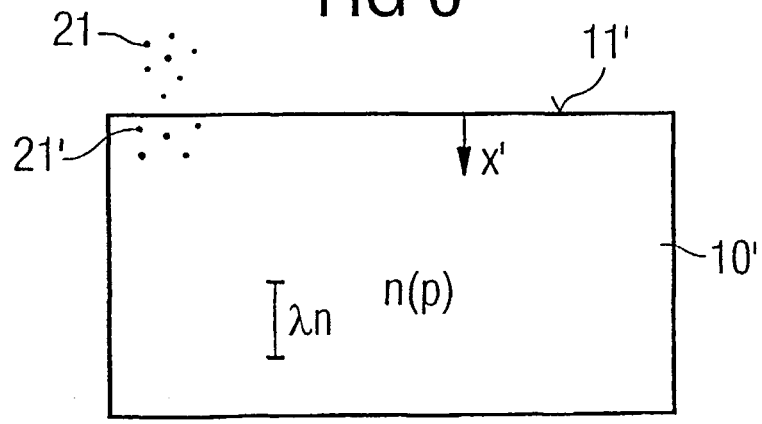
FIG. 6: a side view of the one crystal body during the production of the area of reduced mean free path length by producing scattering centers in the crystal body.

The scattering centers 21', as in the case of body 1 according to FIGS. 2 through 4 and as indicated in FIG. 6, may be created by introducing non-doping particles of foreign matter 21 into the crystal body 10', e.g., by adding non-doping particles of foreign matter 21 during the growth of crystal body 10' of the certain mean free path length 8$n$ into the crystal body 10' and/or by diffusion of non-doping particles of foreign matter 21 into the crystal body 10'.

A smaller mean free path length 8$r$ which varies in direction x' can be created by varying over time the quantity of non-doping particles of foreign matter 21 made available to create scattering centers 21' in the crystal body 10' during the growth of the crystal body.

Depending on the desired dimensions of an electronic component manufactured using the body 1 according to FIG. 5, the crystal body 10' and/or the crystal body 10" can be made thinner by polishing and/or etching steps. Additional method steps necessary to finish the component may then optionally be performed.

The invention claimed is:

1. A Semiconductor device with a pn-junction, the semiconductor device comprising:
    a substrate crystal of doped silicon with a predefined mean free path length for free charge carriers; and
    an epitaxial crystal layer of an n-doped silicon on the substrate crystal,
    wherein a pn-junction is formed between the semiconductor crystal and the crystal layer or at a side of the crystal layer opposite to the semiconductor crystal,
    wherein the crystal layer comprises at least locally non-doping germanium atoms or carbon atoms, or both, as scattering centers introduced during the crystal growth and the crystal layer has a mean free path length for free charge carriers smaller than the predefined mean free path length, and
    wherein the mean free path length in the n-doped crystal layer varies such that the mean free path length is more reduced, relative to the predefined mean free path length, in those areas of the n-doped crystal layer in which an electrical field strength is higher when a blocking voltage is applied to the pn-junction, and such that the mean free path length is reduced less, relative to the predefined mean free path length, in those areas of the n-doped crystal layer where the field strength is smaller when a blocking voltage is applied to the pn-junction.

* * * * *